United States Patent
Mashimo et al.

(10) Patent No.: US 6,876,707 B2
(45) Date of Patent: Apr. 5, 2005

(54) SIGNAL PROCESSING CIRCUIT AND SIGNAL PROCESSING METHOD

(75) Inventors: Akira Mashimo, Tokorozawa (JP); Keishi Ueno, Hanno (JP)

(73) Assignee: TEAC Corporation, Tokyo (JP)

( * ) Notice: Subject to any disclaimer, the term of this patent is extended or adjusted under 35 U.S.C. 154(b) by 790 days.

(21) Appl. No.: 09/740,666

(22) Filed: Dec. 19, 2000

(65) Prior Publication Data

US 2001/0014131 A1 Aug. 16, 2001

(30) Foreign Application Priority Data

Dec. 20, 1999 (JP) ............................................ 11-361558
Dec. 15, 2000 (JP) ....................................... 2000-381245

(51) Int. Cl.$^7$ .............................................. H04L 25/34
(52) U.S. Cl. ...................... 375/289; 375/354
(58) Field of Search ............................. 375/289, 354, 375/855.5, 353; 327/28, 29, 30; 329/342; 369/59, 47.28, 47.16; 377/37; 360/77.08, 32

(56) References Cited

U.S. PATENT DOCUMENTS

| | | | |
|---|---|---|---|
| 4,286,223 A | | 8/1981 | Shearer |
| 4,872,155 A | * | 10/1989 | Yokogawa et al. ...... 369/47.28 |
| 4,982,110 A | * | 1/1991 | Yokogawa et al. ...... 369/47.21 |
| 5,142,420 A | * | 8/1992 | Tanaka et al. ................. 360/32 |
| 5,272,448 A | * | 12/1993 | Hedstrom et al. .......... 329/312 |
| 5,517,371 A | * | 5/1996 | Takei ....................... 360/77.08 |
| 6,111,831 A | * | 8/2000 | Alon et al. .............. 369/47.16 |
| 6,226,345 B1 | * | 5/2001 | Skergan ....................... 377/37 |
| 6,670,831 B2 | * | 12/2003 | Mashimo ...................... 327/34 |

FOREIGN PATENT DOCUMENTS

| | | |
|---|---|---|
| DE | 3031342 C1 | 8/1980 |
| JP | 08-214033 | 8/1996 |

OTHER PUBLICATIONS

Copy of German Office Action from German Patent Office (5 pages) with English translation thereof (3 pages).
Tietze, Ulrich and Schenk, Ghristoph: Semiconductor Circuit Design, 3rd Edition, 1974, p. 512.

* cited by examiner

Primary Examiner—Don N. Vo
(74) Attorney, Agent, or Firm—Anderson Kill & Olick P.C.; Eugene Lieberstein; Michael N. Meller

(57) ABSTRACT

A signal processing circuit generating a digital signal based on an input pulse signal is provided, which circuit includes a clock pulse output circuit which outputs clock pulses having one of positive and negative polarities for a period which includes a pulse of the input pulse signal, a counter circuit which counts the clock pulses, and an output circuit which outputs the digital signal based on a counted value of the counter circuit.

20 Claims, 12 Drawing Sheets

ZERO LEVEL

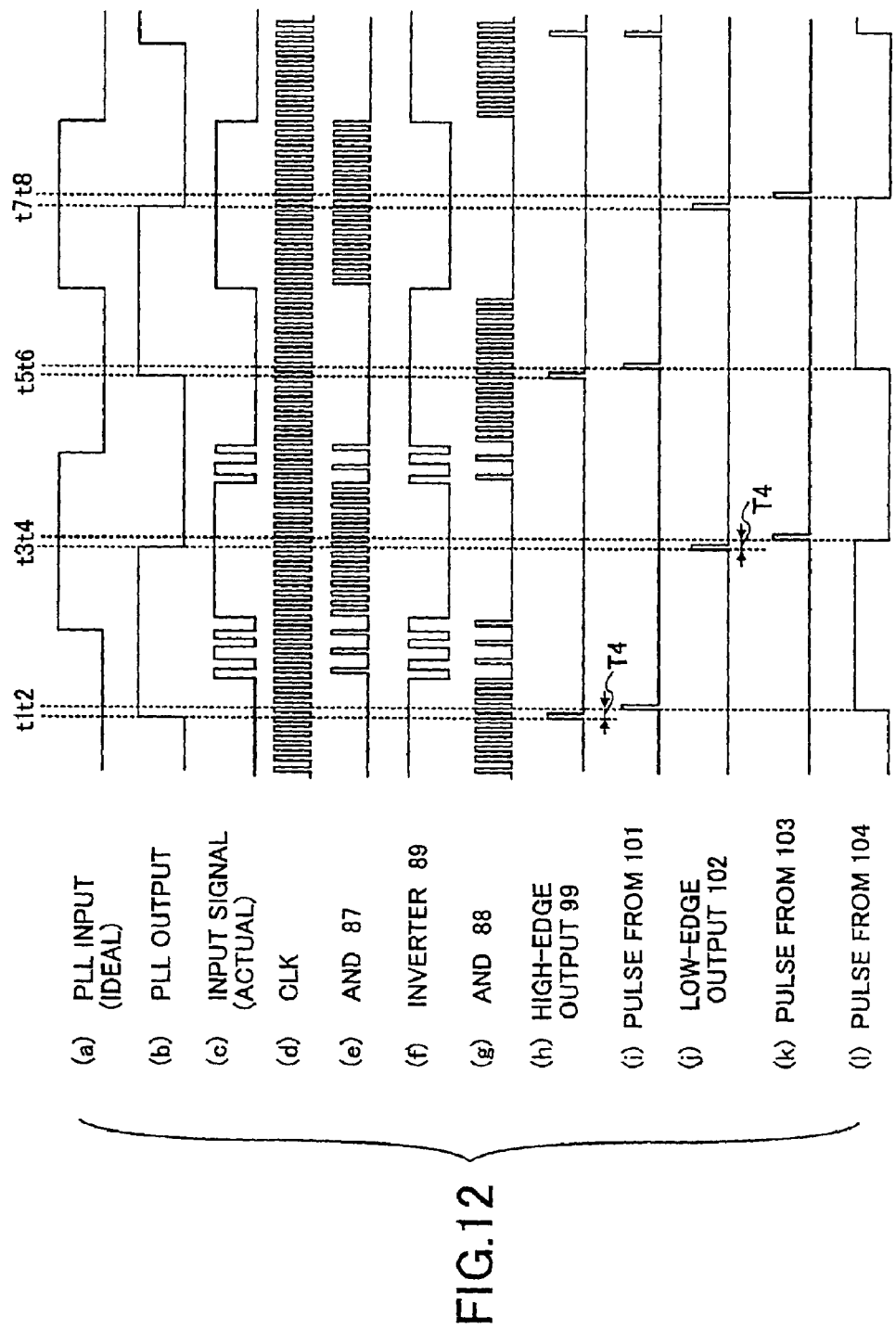

SIGNAL PROCESSING CIRCUIT AND SIGNAL PROCESSING METHOD

BACKGROUND OF THE INVENTION

1. Field of the Invention

The present invention relates generally to signal processing circuits and methods, and more particularly to a signal processing circuit for processing a digital signal generated from a frequency modulation (FM) signal in an optical disk apparatus and a method of processing such a digital signal.

2. Description of the Related Art

Conventionally, a signal processing circuit used for generating a digital FM signal from an FM signal is provided in a reproduction system of an optical disk apparatus.

FIG. 1 is a block diagram showing a conventional signal processing circuit 10, and FIG. 2 is an ideal timing chart of signals in the conventional signal processing circuit 10. In FIG. 1, the signal processing circuit 10 includes a two-edge detection circuit 11, a counter circuit 12, a latch circuit 13, and a digital low-pass filter (LPF) circuit.

The two-edge detection circuit 11 is supplied with an FM signal shown in FIG. 2(a) from a terminal 15. The two-edge detection circuit 11 converts the supplied FM signal into an FM pulse signal shown in FIG. 2(b) so that a level of the FM pulse signal becomes "High" when a level of the FM signal is higher than a zero level and "Low" when the level of the FM signal is lower than the zero level. Further, the two-edge detection circuit 11 generates a two-edge signal 18 shown in FIG. 2(c) by detecting rising and falling edges of the FM pulse signal. The two-edge signal 18 is supplied to the counter circuit 12, the latch circuit 13 and the digital LPF circuit 14.

The counter circuit 12 is supplied with clock pulses from a terminal 16 and with the two-edge signal 18 from the two-edge detection circuit 11. The counter circuit 12 counts the clock pulses to supply a counted value 19 expressed in bits Q1 through Qn to the latch circuit 13. Also, as receiving the two-edge signal 18, the counter 12 is reset by the two-edge signal 18 and counts the clock pulses between the rising and falling edges.

In FIG. 2(d), when the count of the clock pulses is continued until the counted value reaches N1, the counted value is reset by an edge output of the two-edge signal 18 shown in FIG. 7(c) to become zero. After the counter circuit 12 is reset, the count of the clock pulses is resumed. When the count continues until the counted value reaches N2, the counted value is again reset by an edge output of the two-edge signal 18. Thus, the counted value becomes N1, N2, N3, and N4 in the order listed each time the counter circuit 12 is reset by the two-edge signal 18.

The latch circuit 13 is supplied with the counted value 19 from the counter circuit 12 and with the two-edge signal 18 from the two-edge detection circuit 11. The latch circuit 13 latches the counted value 19 based on timings of edge outputs of the two-edge signal 18. In FIG. 2(d), the latch circuit 13 latches each of the counted values N1 through N4 at each timing at which the counted value is reset. A latched counted value 20 is supplied to the digital LPF 14.

The digital LPF 14 is supplied with the latched counted value 20 from the latch circuit 13 and with the two-edge signal 18 from the two-edge detection circuit 11. The digital LPF 14 performs a digital processing on the FM signal based on the latched counted value 20 supplied from the latch circuit 13 so as to eliminate high frequency components from the FM signal. The digitally processed FM signal is supplied to a terminal 17. A signal processing is then performed based on an output digital data of the digital LPF 14.

Thus, according to the signal processing circuit 10, the two-edge signal 18 generated from the FM pulse signal generated from the FM signal is detected, so that the counter circuit 12 counts the number of the clock pulses based on timings of edge outputs of the two-edge signal 18. The digital processing is then performed based on the counted value of the clock pulses and the signal processing is further performed.

In the case of performing the signal processing at the ideal timings shown in FIG. 2, a signal or a counted value based on the FM signal can be obtained, and therefore a correct digital FM signal can be obtained. However, an actual FM signal contains noises.

FIG. 3 is a diagram showing a waveform of an actual FM signal and an enlarged view of the waveform around a zero level. In FIG. 3, since the FM signal crosses the zero level a plurality of times in its neighborhood due to noises contained in the FM signal, each of rising and falling edges of the FM signal is detected a plurality of times. Therefore, the two-edge detection circuit 11 shown in FIG. 1 is prevented from correctly detecting the rising and falling edges of the FM signal, thus preventing a correct two-edge signal 18 from being supplied.

FIG. 4 is a timing chart in an actual signal processing. FIGS. 4(a) through (d) show an FM pulse signal, a two-edge signal, clock pulses (CLK), and a count value, respectively. A timing chart of each signal of FIG. 4 is based on the actual FM signal shown in FIG. 3, which signal contains the noises.

Since the FM signal shown in FIG. 3 crosses the zero level a plurality of times due to the noises contained in the FM signal, the FM pulse signal shown in FIG. 4(a) includes a plurality of risings and failings in respective rising and falling periods T1 and T2 of the FM pulse signal. These risings and failings are called chattering.

Due to the chattering generated in the FM pulse signal, a plurality of edges are detected in the respective periods T1 and T2 as shown in FIG. 9(b). Therefore, a position at which the count of the clock pulses is started cannot be determined correctly, thus preventing the counted value shown in FIG. 4(d) from being correctly obtained.

Accordingly, in the case of processing the actual FM signal in the signal processing circuit, a signal processing is prevented from being performed on a correct digital FM signal due to the chattering caused in the FM pulse signal by the noises contained in the FM signal.

For this reason, a below-described method has been employed so that a correct digital FM signal can be obtained even in the case of processing the FM pulse signal in which the chattering is caused.

FIG. 5 is a timing chart of signals in a conventional method of eliminating chattering. FIGS. 5(a) through (c) show an FM pulse signal, an FM pulse signal from which the chattering is eliminated, and a two-edge signal, respectively. After the chattering is eliminated from the FM pulse signal of FIG. 5(a) in the two-edge detection circuit 11 shown in FIG. 1, the FM pulse signal of FIG. 5(a) is converted into the FM pulse signal of FIG. 5(b). The two-edge signal of FIG. 5(c) is generated based on the FM pulse signal of FIG. 5(b).

With respect to the chattering-eliminated FM pulse signal of FIG. 5(b), if chattering is caused at a timing t1, for example, a rising edge is prevented from being confirmed until a timing t2 at which the chattering disappears. Then, after the FM pulse signal is maintained at a constant level for a predetermined period T3, the FM pulse signal confirms the detection of the rising edge at a timing t3. At this time, a period Tx is required for confirming the detection of the rising edge of the chattering-eliminated FM pulse signal.

Next, if chattering is caused at a timing t4, a falling edge is prevented from being confirmed until a timing t5 at which the chattering disappears. Then, after the FM pulse signal is maintained at a constant level for the predetermined period T3, the FM pulse signal confirms the detection of the falling edge at a timing t6. At this time, a period Ty is required for confirming the detection of the falling edge of the chattering-eliminated FM pulse signal.

On the other hand, since no chattering is caused at timings t7 and t9, the respective detections of rising and falling edges are delayed by the predetermined period T3 so as to be confirmed at timings t8 and t10, respectively.

Thus, the chartering-eliminated FM pulse signal is generated by such a method which confirms the detection of a rising or falling edge when the FM pulse signal is maintained at a constant level for a predetermined period. In this method, when chartering is caused, a delay in confirming the detection of an edge is a total of a period required before the disappearance of the chattering and the predetermined period, and when no chattering is caused, the delay is only the predetermined period.

As previously described, an actual signal contains noises, thus preventing a rising or falling edge of the signal from being detected at a constant period. Therefore, a correct signal processing is prevented from being performed.

Further, in the case of confirming the detection of an edge by delaying the confirmation, in order to eliminate the noises, for a total of a predetermined period and a period during which the noises are caused, a delay in detecting the edge differs depending on the presence or absence of the noises. Therefore, a period of the signal is changed. Thereby, the counted value becomes abnormal and a value held by the latch circuit is also increased/decreased with respect to a normal value. As a result, a correct signal cannot be obtained.

SUMMARY OF THE INVENTION

It is a general object of the present invention to provide a signal processing circuit and a signal processing method, in which the above disadvantages are eliminated.

A more specific object of the present invention is to provide a signal processing circuit and a signal processing method which can process an input pulse signal in a correct period.

The above objects of the present invention are achieved by a signal processing circuit generating a digital signal based on an input pulse signal, which circuit includes a clock pulse output circuit which outputs clock pulses having one of positive and negative polarities for a period which includes a pulse of the input pulse signal, a counter circuit which counts the clock pulses, and an output circuit which outputs the digital signal based on a counted value of said counter circuit.

According to the above-described circuit, the counted values of the clock pulses can be obtained from both high and low levels of the input pulse signal. Therefore, a more correct digital signal can be output based on these counted values.

The above objects of the present invention are also achieved by a method of generating a digital signal based on an input pulse signal, which method includes the steps of (a) outputting clock pulses of a positive or negative polarity for a period including a pulse of the input pulse signal, (b) counting the clock pulses, and (c) outputting the digital signal based on the counted value obtained in the step (b).

According to the above-described method, the counted values of the clock pulses can be obtained from both high and low levels of the input pulse signal. Therefore, a more correct output digital signal can be output based on these counted values.

BRIEF DESCRIPTION OF THE DRAWINGS

Other objects, features and advantages of the present invention will become more apparent from the following detailed description when read in conjunction with the accompanying drawings, in which:

FIG. 12 is a timing chart of signals in the signal processing circuit of FIG. 11.

DETAILED DESCRIPTION OF THE PREFERRED EMBODIMENTS

A description will be given, with reference to the accompanying drawings, of embodiments of the present invention.

Figure 6:
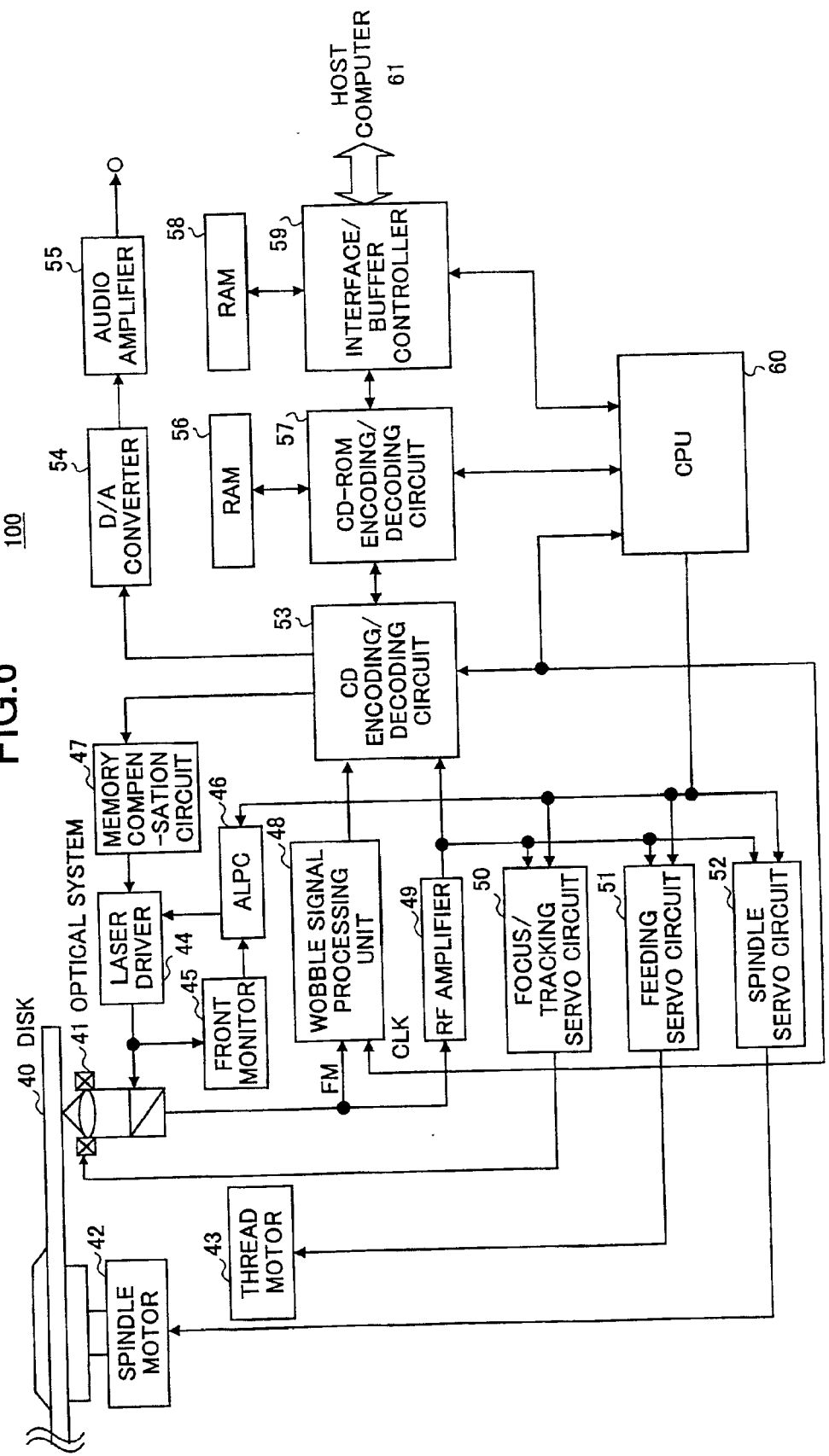
FIG. 6 is a block diagram of an optical disk apparatus according to a first embodiment of the present invention.

FIG. 6 is a block diagram of an optical disk apparatus 100 according to a first embodiment of the present invention.

In FIG. 6, the optical disk apparatus 100 includes a disk 40, an optical system 41, a spindle motor 42, a thread motor 43, a laser driver 44, a front monitor 45, an ALPC (Absolute Time In Pregroove) 46, a memory compensation circuit 47, a wobble signal processing unit 48, an RF (radio frequency) amplifier 49, a focus/tracking servo circuit 50, a feeding servo circuit 51, a spindle servo circuit 52, a CD encoding/decoding circuit 53, a D/A (digital-to-analog) converter 54, an audio amplifier 55, RAMs 56 and 58, a CD-ROM encoding/decoding circuit 57, an interface/buffer controller 59, a CPU (central processing unit) 60, and a host computer 61.

A signal processing circuit for performing a signal processing according to the first embodiment of the present invention is provided in the wobble signal processing unit 48. An FM signal is processed through this circuit so that a digital FM signal is generated. On the other hand, a recording system includes the optical system 41, the laser driver 44, the front monitor 45, the ALPC 46, the memory compensation circuit 47, and the wobble signal processing unit 48. A signal is recorded on a recording medium such as an optical disk through these circuits.

The optical system 41, which shows an optical head for reading a signal from the disk 40, includes an objective lens, an actuator, a ¼ wavelength plate, a collimator lens, a beam splitter, a lighting emitting element (laser diode), and a photo-electric element (photodetector). The optical system 41 is controlled by the thread motor 43 and the focus/tracking servo circuit 50.

The thread motor 43 is controlled by the feeding servo circuit 51 so as to move an optical pickup in a radial direction of the disk 40. The focus/tracking servo circuit 50 serves to control both a focus servo and a tracking servo.

The disk 40, which is a CD-R (compact disk recordable) or a CD-RW (compact disk rewritable), is controlled by the spindle motor 42.

The spindle motor 42 is controlled by the spindle servo circuit 52 so that the disk 40 is rotated at a predetermined rotation speed.

As previously described, the focus/tracking servo circuit 50, the feeding servo circuit 51, and the spindle servo circuit 52 perform their respective control operations based on signals from the CPU 60 and the RF amplifier 49. The RF amplifier 49 is a head amplifier for amplifying a reproduction signal and includes a matrix amplifier. The amplified reproduction signal is supplied from the RF amplifier 49 to the respective servo control circuits.

By these control circuits, a desired position of the disk 40 is determined, and the reproduction signal from the disk 40 is transmitted from the optical system 41 to the RF amplifier 49. An EFM signal is transmitted from the RF amplifier 49 to the CD encoding/decoding circuit 53, which performs an encoding/decoding using CIRC (cross-interleave Reed-Solomon code), a modulation/demodulation using EFM (eight to fourteen modulation), and a synchronism detection. A demodulation process in the CD encoding/decoding circuit 53 is performed based on clock pulses supplied from the CPU 60 to the CD encoding/decoding circuit 53. The demodulated signal is transmitted to the CD-ROM encoding/decoding circuit 57, which serves to perform such processes as an encoding/decoding using ECC (Error Correction Coding) peculiar to a CD-ROM, and a header detection. In order to perform these processes, data is temporarily stored in the RAM 56. The processed data is transmitted to the interface/buffer controller 59, which serves to transmit/receive data to/from the host computer 61 and to control a data buffer. In order to perform the processes, the data is temporally stored in the RAM 58.

The previously described CD-ROM encoding/decoding circuit 57 and interface/buffer controller 59 are also controlled by the CPU 60. The results of the processes performed in the interface/buffer controller 59 is transmitted to the host computer 61, where a process is performed in accordance with the transmitted data.

On the other hand, in the case of outputting an audio signal, the demodulation signal is transmitted from the CD encoding/decoding circuit 53 to the D/A converter 54 so as to be converted from a digital signal into an analog signal. The analog signal is amplified by the audio amplifier 55 to be output as an audio signal.

Thus, the optical disk apparatus 100 performs a reproduction/recording process. The signal processing circuit according to the present invention is provided in the wobble signal processing unit 48 of the reproduction system so as to process a digital FM signal generated from the FM signal.

A description will now be given of a second embodiment of the present invention.

Figure 7:
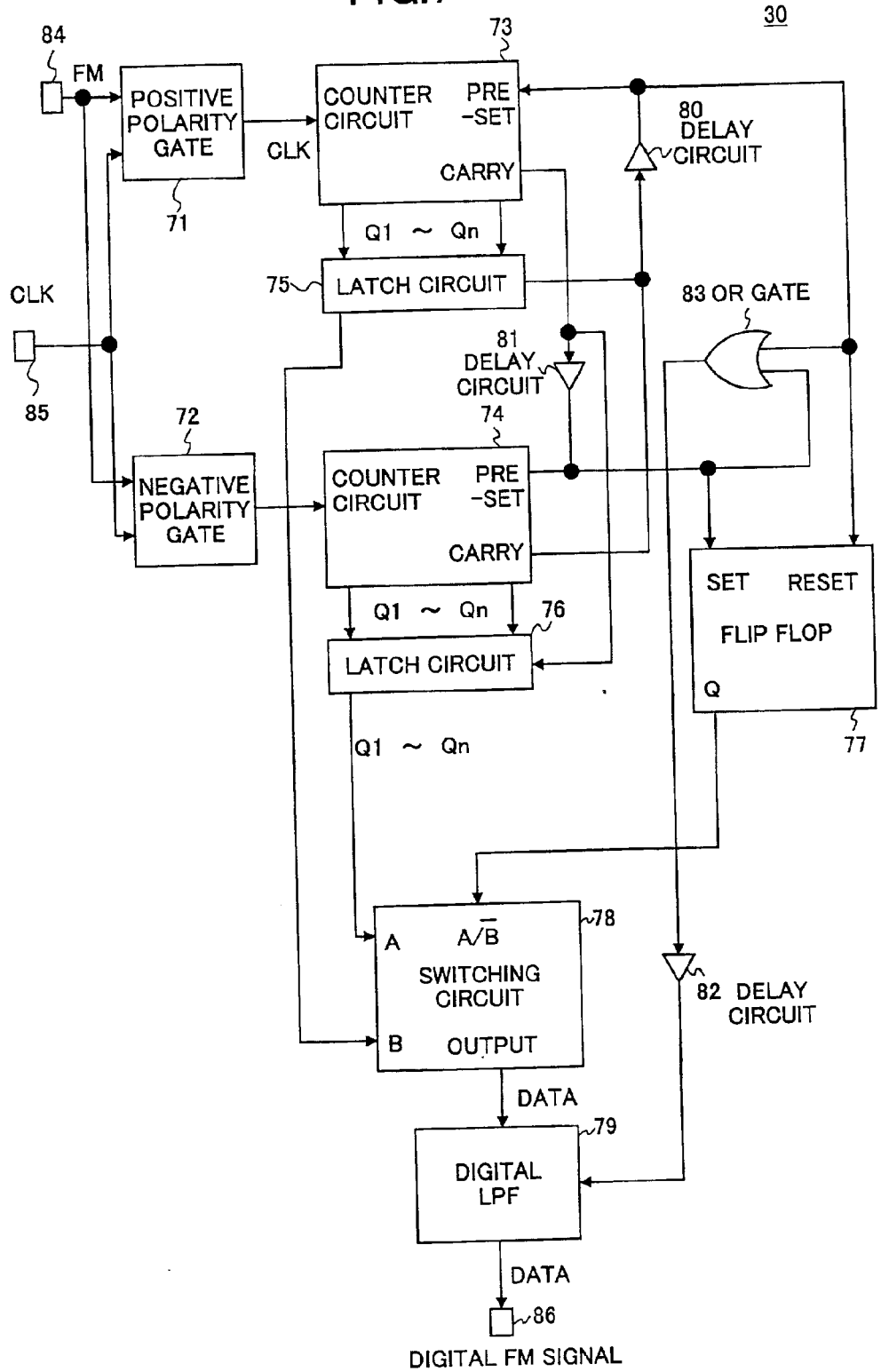
FIG. 7 is a block diagram showing a signal processing circuit according to a second embodiment of the present invention.

FIG. 7 is a block diagram showing a signal processing circuit 30 according to the second embodiment.

In FIG. 7, the signal processing circuit 30, which is provided in the wobble signal processing unit 48 of FIG. 6, includes a positive polarity (active-high) gate 71, a negative polarity (active-low) gate 72, a counter circuit (positive polarity) 73, a counter circuit (negative polarity) 74, latch circuits 75 and 76, a switching circuit 78, a digital LPF 79, an R-S flip flop 77, delay circuits 80 through 82, and an OR gate 83.

Each of the positive and negative polarity gates 71 and 72 is coupled to a wobble FM pulse signal terminal 84 and to a clock terminal 85. To each of the positive and negative polarity gates 71 and 72, an FM pulse signal is supplied from the wobble FM pulse signal terminal 84 and a clock pulse signal is supplied from the clock terminal 85.

The positive polarity gate 71 transmits clock pulses to the counter circuit 73 when the FM signal has a level higher than a zero level, that is, when the FM pulse signal is at a high level. The negative polarity gate 72, on the other hand, transmits the clock pulses to the counter circuit 74 when the FM signal has a level lower than the zero level, that is, when the FM pulse signal is at a low level.

The counter circuit 73, which includes a preset input and a carry output, counts the clock pulses supplied from the positive polarity gate 71. The counter circuit 73 resets a counted value expressed in bits Q1 through Qn when a pulse is input to the preset input. Further, the counter circuit 73 outputs a pulse to the delay circuit 81 and to the latch circuit 76 when the counted value becomes a predetermined value.

The delay circuit 81 delays a carry pulse (output) of the counter circuit 73 for a predetermined period and supplies the carry pulse to the preset input of the counter circuit 74, a set input of the R-S flip flop 77, and the OR gate 83.

The latch circuit 75 latches the counted value supplied from the counter circuit 73 by means of the carry pulse of the counter circuit 74. The latched counted value is supplied to a B input of the switching circuit 78.

The counter circuit 74, which includes a preset input and a carry output, counts the clock pulses supplied from the negative polarity gate 72. The counter circuit 74 resets a counted value when the pulse supplied from the counter circuit 73 is input to the preset input. Further, the counter circuit 74 outputs a pulse to the delay circuit 80 and to the latch circuit 75 when the counted value becomes a predetermined value.

The delay circuit 80 delays a carry pulse (output) of the counter circuit 74 for a predetermined period and supplies the carry pulse to the preset input of the counter circuit 73, a reset input of the R-S flip flop 77, and the OR gate 83.

The latch circuit 76 latches the counted value supplied from the counter circuit 74 by means of the carry pulse of the counter circuit 73. The latched counted value is transmitted to an A input of the switching circuit 78.

The switching circuit 78 switches between the counted values supplied to the A and B inputs from the latch circuits 76 and 75, respectively, based on a pulse signal (Q output) supplied from the R-S flip flop 77.

The R-S flip flop 77, which includes the set and reset inputs, transmits the Q output to the switching circuit 78 so as to control a switching operation thereof.

Based on the above-mentioned Q output, an output of the switching circuit 78 is switched between the counted values input to the A and B inputs, respectively. The output of the switching circuit 78 is supplied to the digital LPF 79, and the digital FM signal is output from the terminal 86.

The digital LPF 79 is also supplied with a pulse obtained by delaying an output of the OR gate 83 in the delay circuit 82. The digital LPF 79 outputs the digital FM signal based on the supplied pulses.

Thus, high-level and low-level periods of the FM pulse signal can be reliably determined by providing the signal processing circuit 30 with the positive and negative polarity gates 71 and 72 so as to obtain timings for counting the clock pulses in the respective high-level and low-level periods of the FM pulse signal to calculate the lengths of the respective periods each including chattering.

Figure 8:
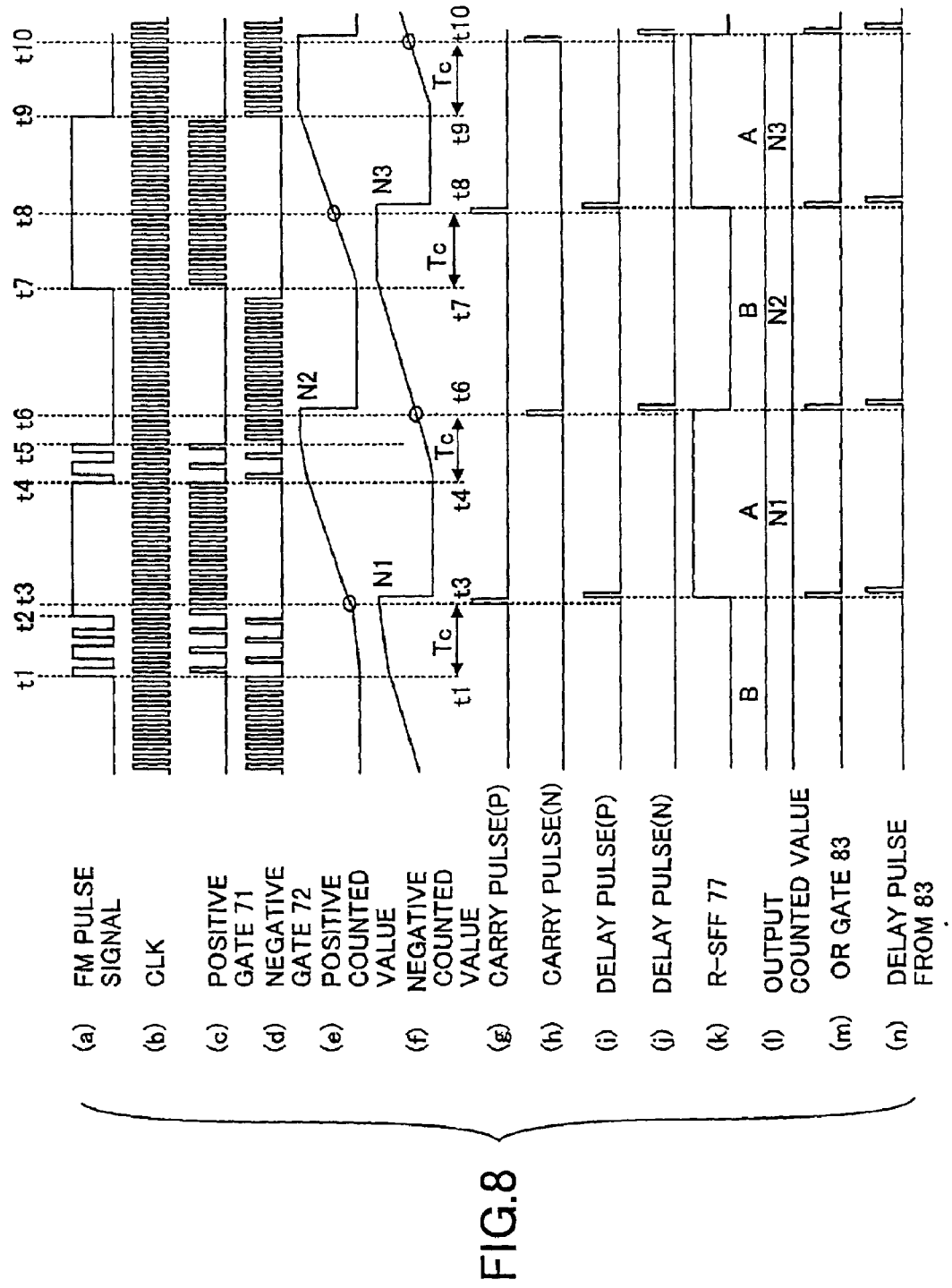
FIG. 8 is a timing chart of signals in the signal processing circuit of FIG. 7.

FIG. 8 is a timing chart of signals in the signal processing circuit 30. FIGS. 8(a) through (n) show the FM pulse signal, the clock pulses (CLK), the output of the positive polarity gate 71, the output of the negative polarity gate 72, the positive polarity (active-high) counted value (counted value of the counter circuit 73), the negative polarity (active-low) counted value (counted value of the counter circuit 74), the carry pulse (positive) (carry output of the counter circuit 73), the carry pulse (negative) (carry output of the counter circuit 74), the delay pulse (positive) (output of the delay circuit 81), the delay pulse (negative) (output of the delay circuit 80), the Q output of the R-S flip flop 77, the output counted value (output of the switching circuit 78), the output of the OR gate 83, and the delay pulse (OR) (output of the delay circuit 82), respectively.

The FM pulse signal of FIG. 8(a) and the clock pulses of FIG. 8(b) are supplied to the respective positive and negative polarity gates 71 and 72. When the FM pulse signal is at the low level, the positive polarity gate 71 is closed while the negative polarity gate 72 is opened, so that the clock pulses are output as shown in FIGS. 8(c) and (d).

At a timing t1, the FM pulse signal is switched to the high level. At this time, the positive polarity gate 71 is opened so as to supply the clock pulses to the counter circuit 73. The counter circuit 73 counts the supplied clock pulses. This positive polarity counted value varies as shown in FIG. 8(e).

During a period between the timing t1 and a timing t2, chattering is caused in the FM pulse signal. At this time, since the clock pulses are supplied only intermittently from the positive polarity gate 71, the positive polarity counted value increases slowly.

After a predetermined period Tc passes since the positive polarity gate 71 starts to supply the clock pulses to the counter circuit 73 at the timing t1, the counter circuit 73 supplies the carry pulse (positive) of FIG. 8(g) to the delay circuit 81 and to the latch circuit 76 at a timing t3. The period Tc is determined based on the positive polarity counted value.

At the timing t3, the latch circuit 76 latches the counted value of the counter circuit 74 based on the carry pulse (positive) supplied from the counter circuit 73. Thereafter, the carry pulse (positive) from the counter circuit 73 is delayed by the delay circuit 81. The delay pulse (positive) shown in FIG. 8(i) is supplied to the preset input of the counter circuit 74. Then, the counted value of the counter circuit 74 is reset. The delay pulse (positive) delayed by the delay circuit 81 is determined in consideration of a latched period.

During a period between the timing t2 and a timing t4, since the FM pulse signal is maintained at the high level, the positive polarity counted value increases to a certain extent.

Figure 1:
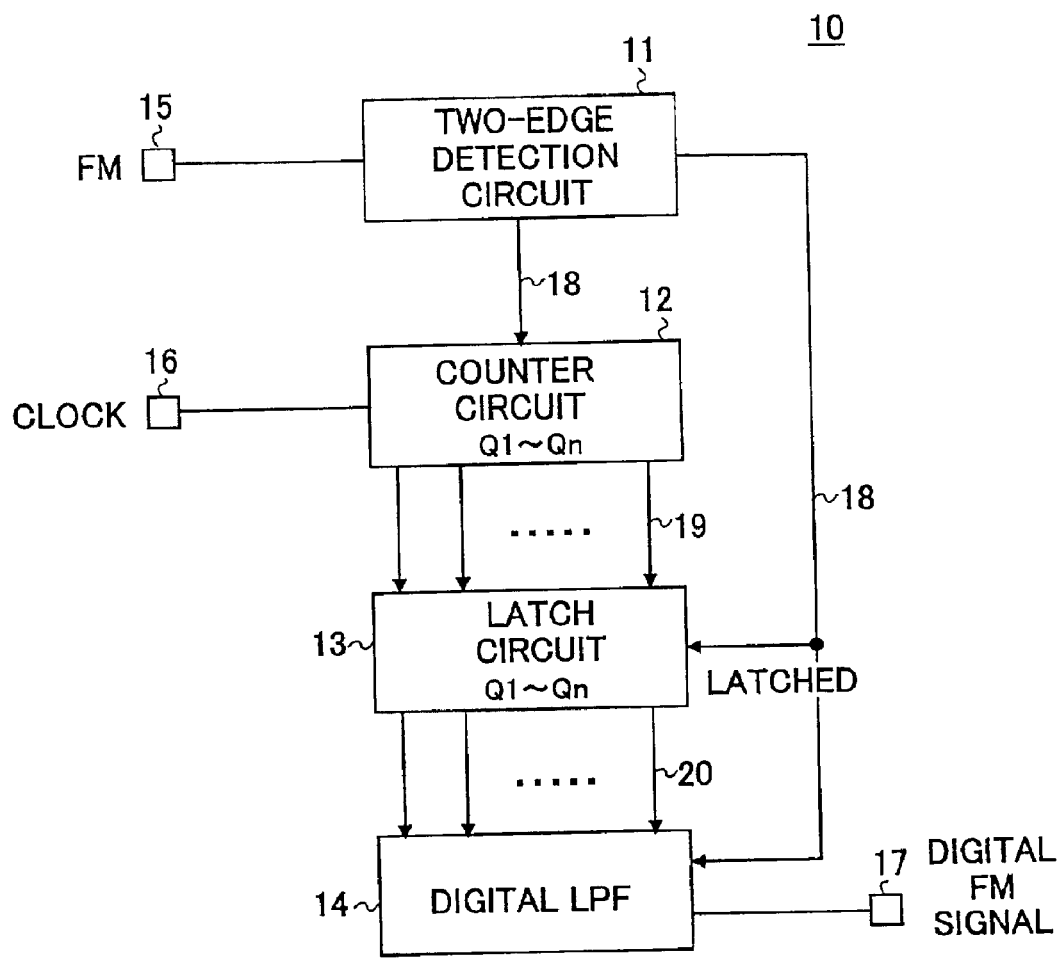
FIG. 1 is a block diagram showing a conventional signal processing circuit.
Figure 2:
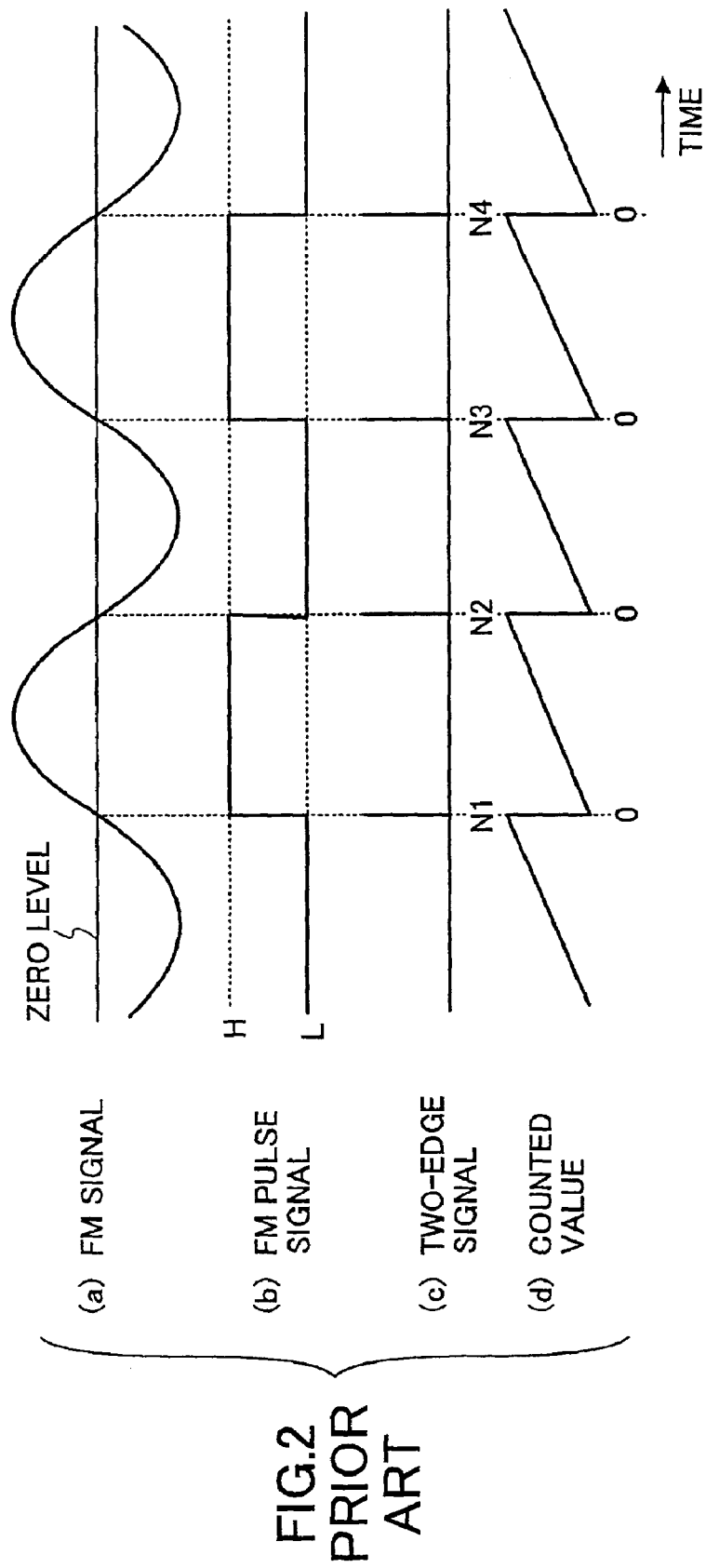
FIG. 2 is an ideal timing chart of signals in the conventional signal processing circuit of FIG. 1.
Figure 3:
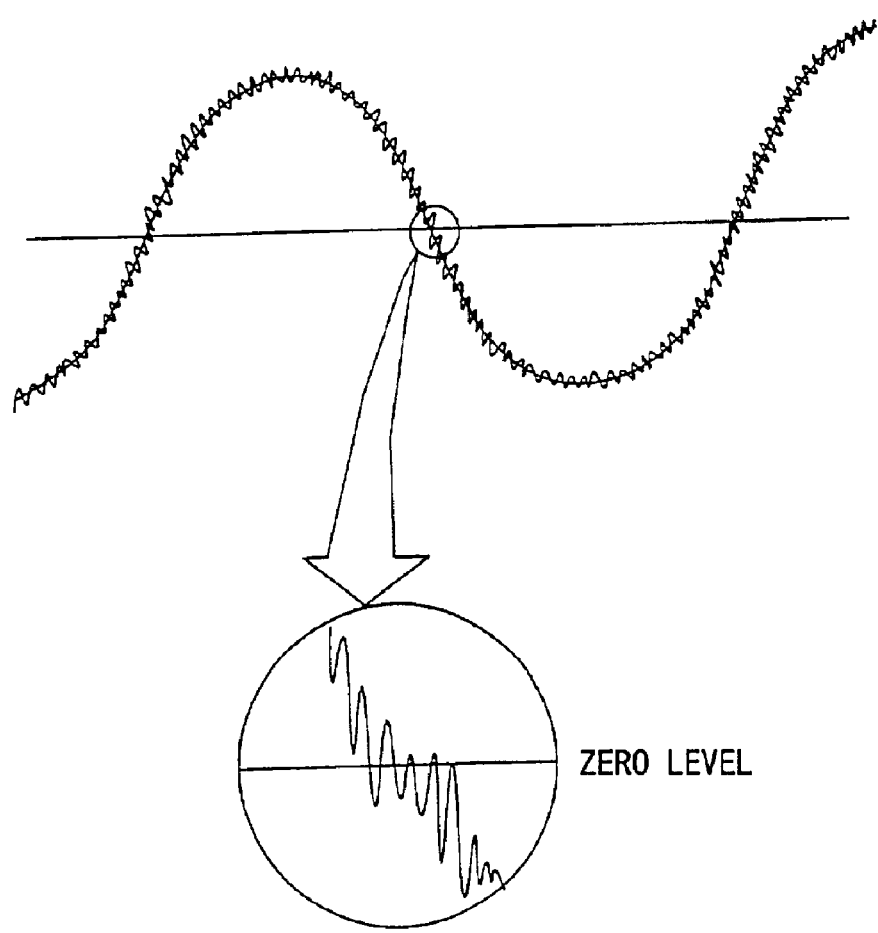
FIG. 3 is a diagram showing a waveform of an actual FM signal and an enlarged view of the waveform around a zero level.
Figure 4:
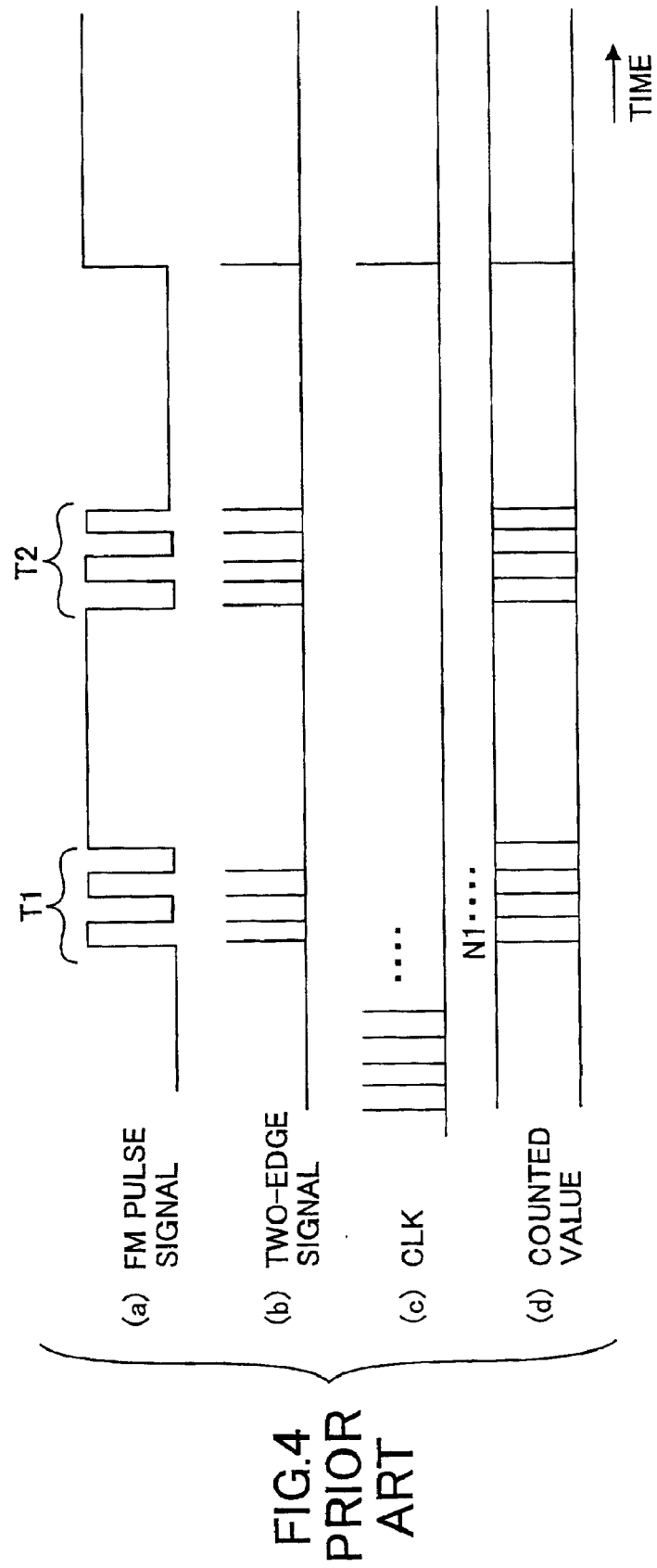
FIG. 4 is a timing chart of signals in an actual signal processing.
Figure 5:
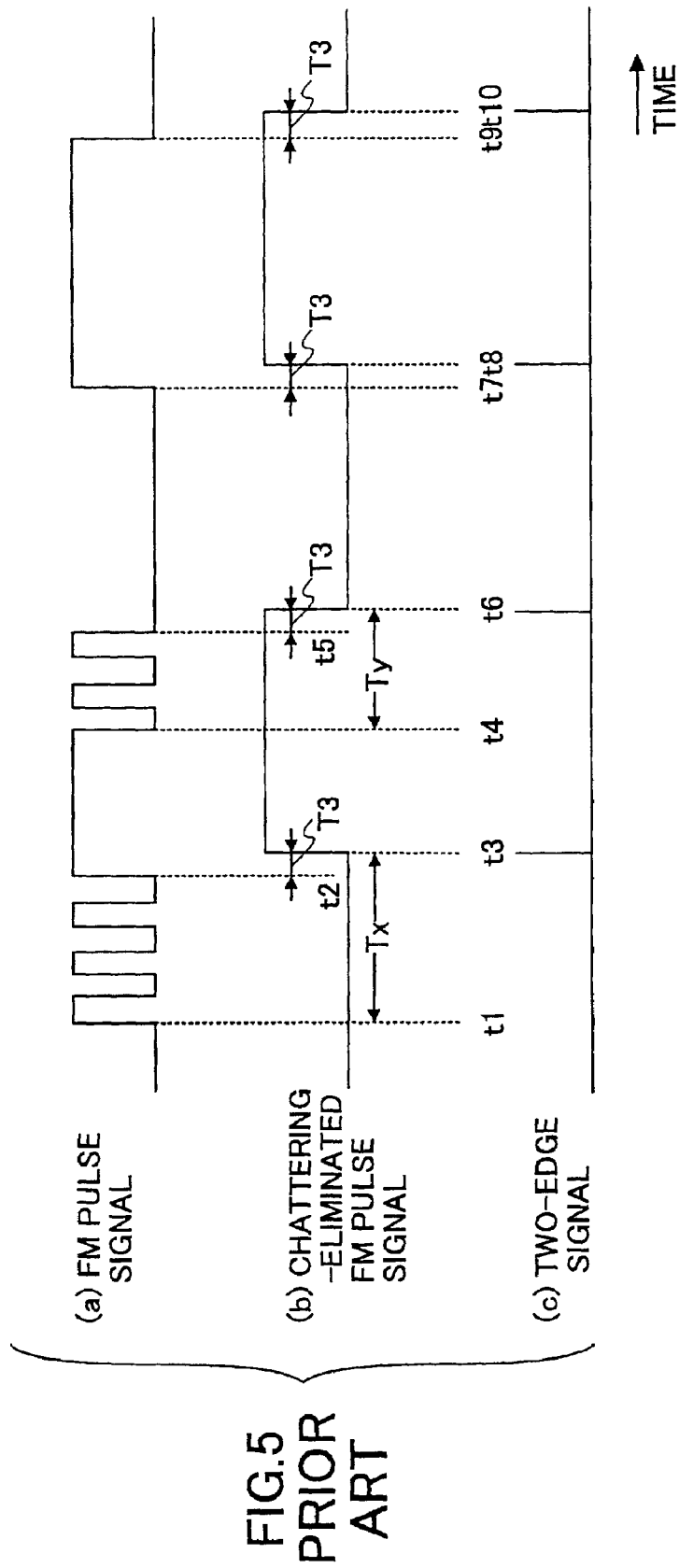
FIG. 5 is a timing chart of signals in a conventional method of eliminating chattering.

At the timing t4, the FM pulse signal is switched to the low level. At this time, the negative polarity gate 72 is opened to supply the clock pulses to the counter circuit 74. The counter circuit 74 counts the supplied clock pulses. This negative polarity counted value varies as shown in FIG. 3(f).

During a period between the timing t4 and a timing t5, chattering is caused in the FM pulse signal. At this time, the clock pulses are supplied intermittently from the respective positive and negative polarity gates 71 and 72. Therefore, both of the positive and negative polarity counted values increase slowly.

After the predetermined period Tc passes since the negative polarity gate 72 starts to supply the clock pulses to the counter circuit 74 at the timing t4, the counter circuit 74 supplies the carry pulse (negative) of FIG. 8(h) to the latch circuit 75, the positive polarity gate 71, and the delay circuit 80 at the timing t6.

At the timing t6, the latch circuit 75 latches the counted value of the counter circuit 73 based on the carry pulse (negative) from the counter circuit 74. Thereafter, the carry pulse (negative) supplied from the counter circuit 74 is delayed by the delay circuit 80. The delay pulse (negative) shown in FIG. 8(j) is supplied to the preset input of the counter circuit 73. Then, the counted value of the counter circuit 73 is reset.

During a period between the timing t6 and a timing t7, since the FM pulse signal is maintained at the low level, the negative polarity counted value increases to a certain extent.

The R-S flip flop 77 is set by the delay pulse (positive) supplied from the delay circuit 81, and is reset by the delay pulse (negative) supplied from the delay circuit 80. The Q output generated based on these set and reset operations is supplied to the switching circuit 78.

The switching circuit 78 performs a switching operation so that the negative polarity counted value input to the A input is output when the Q output is at a high level, and the positive polarity counted value input to the B input is output when the Q output is at a low level. The output of the switching circuit 78 is shown as the output counted value of FIG. 8(l). That is, the output of the switching circuit 78 is switched to the positive polarity counted value by the carry pulse (positive) and to the negative polarity counted value by the carry pulse (negative). When these carry pulses are supplied to the OR gate 83, the output shown in FIG. 8(m) is output from the OR gate 83. The output of the OR gate 83 is supplied to the delay circuit 82, so that the output is delayed as shown in FIG. 8(n). The delay provided by the delay circuit 82 is determined in consideration of a period which the switching circuit 78 requires in outputting the counted value.

The output data (counted value) of the switching circuit 78 and the pulse delayed by the delay circuit 82 (delay pulse) are transmitted to the digital LPF 79. The signal processing is performed on the data transmitted to the digital LPF 79 based on the delay pulse.

Thus, in the FM pulse signal having chattering caused therein, by switching between the positive and negative polarity gates 71 and 72 by using the period Tc, namely, the positive and negative polarity counted values, the counted values each having a more correct period can be obtained. Accordingly, a proper signal processing can be performed.

On the other hand, in a case where no chattering is caused as in a period between the timing t7 and a timing t8, a switching operation is performed to switch between the positive and negative polarity gates 71 and 72 after the period Tc passes since a rising or falling is caused in the FM pulse signal. Thereafter, the respective counter circuits 73 and 74 and the respective latch circuits 75 and 76 are controlled as described above so that the signal processing is performed.

Thus, even when no chattering is caused, by switching the positive and negative polarity gates 71 and 72 by using the period Tc, namely, the positive and negative polarity counted values, the counted values each having the correct period can be obtained. As a result, the proper signal processing can be performed.

A description will now be given of a third embodiment of the present invention.

Figure 9:
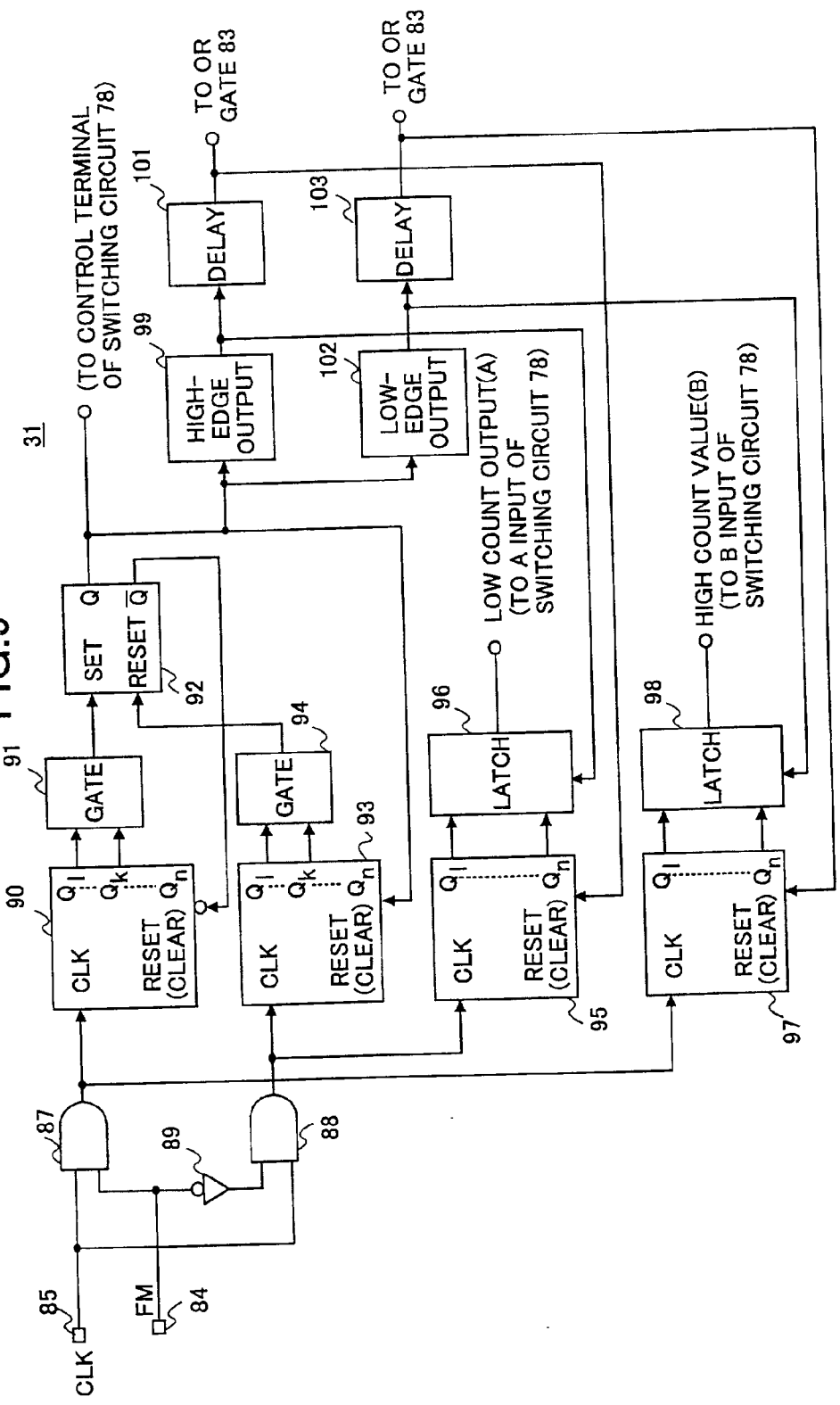
FIG. 9 is a block diagram of a signal processing circuit according to a third embodiment of the present invention.

FIG. 9 is a block diagram of a signal processing circuit 31 according to the third embodiment. The signal processing circuit 31 is a variation of the signal processing circuit 30 shown in FIG. 7. In FIG. 9, the same elements as those of FIG. 7 are referred to by the same numerals and a description thereof will be omitted. In FIG. 9, the signal processing circuit 31 includes AND gates 87 and 88, an inverter 89, a high-gate counter 90, a low-gate counter 93, a counter circuit (positive polarity) 97, a counter circuit (negative polarity) 95, gate circuits 91 and 94, latch circuits 96 and 98, an R-S flip flop 92, a high-edge output circuit 99, a low-edge output circuit 102, and delay circuits 101 and 103.

The AND gate 87 is connected to an FM pulse signal terminal 84 and a clock terminal 85 so as to perform an AND operation based on an FM pulse signal and clock pulses supplied from the FM pulse signal terminal 84 and from the clock terminal 85, respectively, to the AND gate 87. The AND gate 88 is connected to the clock pulse terminal 85 and the inverter 89 so as to perform an AND operation based on the clock pulses and an inverted FM pulse signal supplied from the inverter 89.

The high-gate counter 90, which includes a preset input and a carry output, counts the clock pulses supplied from the AND gate 87. The high-gate counter 90 counts the clock pulses while the FM pulse signal is at a high level, and supplies a counted value expressed in bits Q1 through Qn to the gate circuit 91.

The gate circuit 91 supplies a pulse to a set input of the R-S flip flop 92 when the supplied counted value reaches a predetermined value, for instance, a value corresponding to half the time of the minimum half period of the FM pulse signal.

The low-gate counter 93, which has the same structure as the above-described high-gate counter 90, counts the clock pulses supplied from the AND gate 88. The low-gate counter 93 counts the clock pulses while the FM pulse signal is at a low level. The low-gate counter 93 supplies the low order bits Q1 through Qk of a counted value expressed in bits Q1 through Qn to the gate circuit 94.

The gate circuit 94 supplies a pulse to a reset input of the R-S flip flop 92 when the supplied counted value reaches a predetermined value, for instance, a value corresponding to half the time of the minimum half period of the FM pulse signal.

When the pulse is supplied from the gate circuit 91 to the set input of the R-S flip flop 92, the R-S flip flop 92 supplies a Q output to the low-gate counter 93 so that the low-gate counter 93 starts to count the clock pulses. When the pulse supplied from the gate circuit 94 is input to the reset input of the R-S flip flop 92, the R-S flip flop 92 supplies an inverted Q output to the high-gate counter 90 so that the high-gate counter 90 starts to count the clock pulses. The Q output is supplied to the switching circuit 78, the high-edge output circuit 99, and the low-edge output circuit 102.

The high-edge output circuit 99 supplies a pulse to the delay circuit 101, and also to the latch circuit 96 at a rising of the Q output. The delay circuit 101 delays the pulse supplied from the high-edge output circuit 99, and supplies the delayed pulse to the counter circuit 95 and to the OR gate 83.

The low-edge output circuit 102 supplies a pulse to the delay circuit 103, and also to the latch circuit 98 at a falling of the Q output. The delay circuit 103 delays the pulse supplied from the low-edge output circuit 102, and supplies the delayed pulse to the counter circuit 97 and to the OR gate 83.

The counter circuit 95, which includes a preset input and a carry output, counts the clock pulses supplied from the AND gate 88. The counter circuit 95 counts the clock pulses while the FM pulse signal is at the low level. Further, the counter circuit 95 supplies a counted value expressed in bits Q1 through Qn to the latch circuit 96. The counted value of the counter circuit 95 is cleared by the pulse supplied from the delay circuit 101.

The latch circuit 96 latches the counted value of the counter circuit 95 based on the pulse supplied from the high-edge output circuit 99. The latched counted value is supplied to the A input of the switching circuit 78.

The counter circuit 97, which has the same structure as the above-described counter circuit 95, counts the clock pulses supplied from the AND gate 87. The counter circuit 97 counts the clock pulses while the FM pulse signal is at the high level. Further, the counter circuit 97 supplies a counted value expressed in bits Q1 through Qn to the latch circuit 98. The counted value of the counter circuit 97 is cleared by the pulse supplied from the delay circuit 103.

The latch circuit 98 latches the counted value of the counter circuit 97 based on the pulse supplied from the low-edge output circuit 102. The latched counted value is supplied to the B input of the switching circuit 78.

Figure 10:
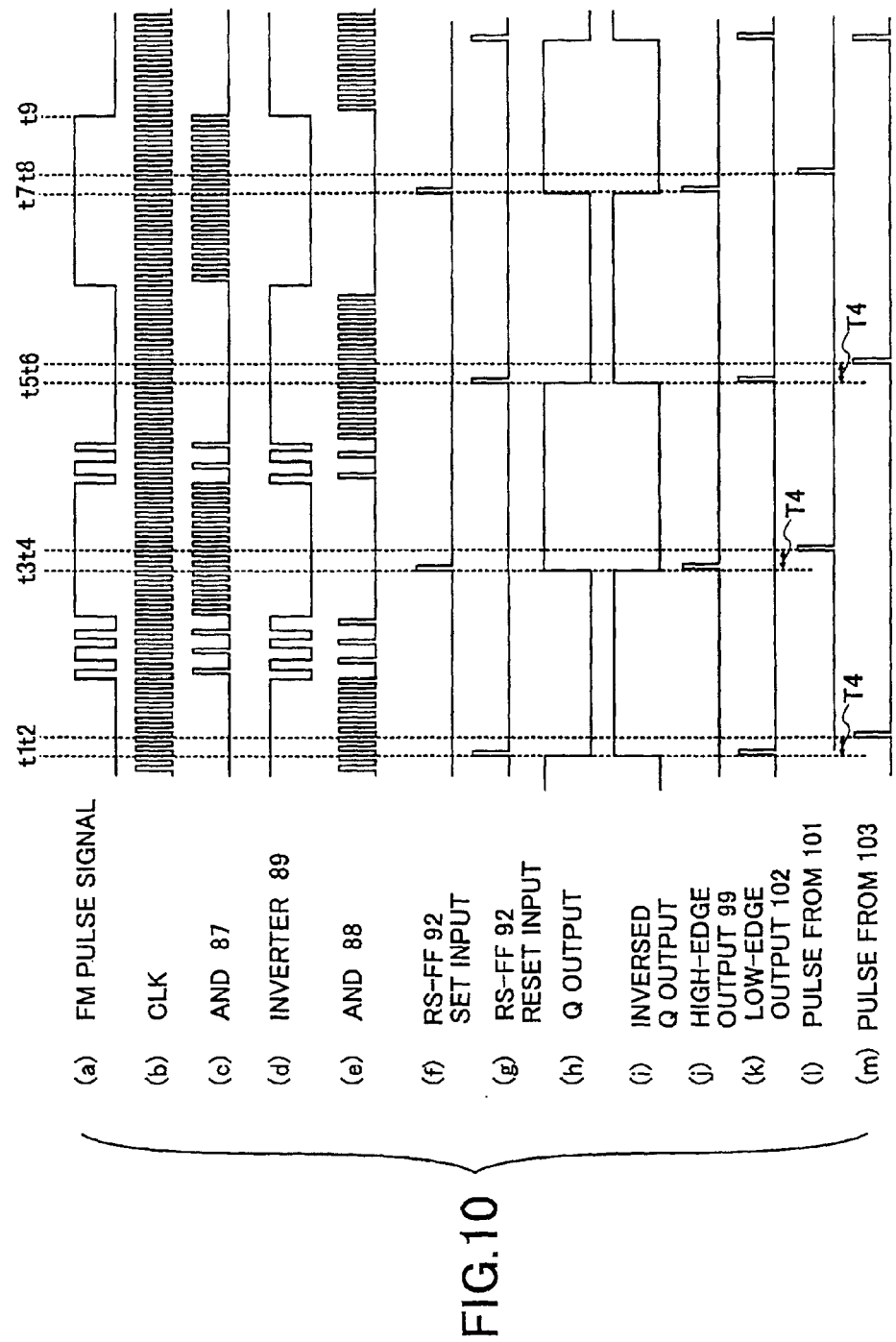
FIG. 10 is a timing chart of signals in the signal processing circuit of FIG. 9.

FIG. 10 is a timing chart of signals in the signal processing circuit 31 shown in FIG. 9. FIGS. 10(a) through (m) show the FM pulse signal, the clock pulses (CLK), the output of the AND gate 87, the output of the inverter 89, the output of the AND gate 88, the input to the set input of the R-S flip flop 92, the input to the reset input of the R-S flip flop 92, the Q output of the R-S flip flop 92, the inversed Q output of the R-S flip flop 92, the output of the high-edge output circuit 99, the output of the low-edge output circuit 102, the delay pulse supplied from the delay circuit 101, and the delay pulse supplied from the delay circuit 103, respectively.

The FM pulse signal of FIG. 10(a) is supplied to the AND gate 87 and to the inverter 89. The clock pulses of FIG. 10(b) are supplied to the AND gates 87 and 88. The output of the inverter 89 shown in FIG. 10(d) shows an inversed signal of the FM pulse signal of FIG. 10(a). The AND circuit 87 performs an AND operation based on the clock pulses and the FM pulse signal so as to output the pulse signal shown in FIG. 10(c). The AND gate 88 performs an AND operation based on the clock pulses and the inversed FM pulse signal so as to output the pulse signal shown in FIG. 10(e).

For instance, the low-gate counter 93 counts the clock pulses supplied from the AND gate 88, and supplies the counted value to the gate circuit 94. The gate circuit 94 supplies the pulse to the reset input of the R-S flip flop 92 when the counted value reaches the predetermined value.

At a timing t1, when the inversed Q output is switched to a high level as shown in FIG. 10(*i*), the counted value of the low-gate counter 93 is reset so that the pulse is supplied to the reset input of the R-S flip flop 92 as shown in FIG. 10(*g*). The high-gate counter 90 counts the clock pulses supplied from the AND gate 87 shown in FIG. 10(*c*) since the Q output of FIG. 10(*h*) is switched to a low level.

At a timing t2, the counted value of the counter circuit 97 is reset by the delay pulse supplied from the delay circuit 103 shown in FIG. 10(*m*). A period between the timings t1 and t2 is a delay period T4 of the pulse output from the delay circuit 103.

At a timing t3, when the counted value of the high-gate counter 90 reaches the predetermined value, the counted value is supplied to the set input of the R-S flip flop 92 as shown in FIG. 10(*f*).

The R-S flip flop 92 sets the Q output of FIG. 10(*h*) at a high level and the inversed Q output of FIG. 10(*i*) at a low level based on the input to the set input of the R-S flip flop 92. By the Q output being switched to the high level, the low-gate counter 93 counts the clock pulses supplied from the AND gate 88 shown in FIG. 10(*e*), and by the Q output being switched to the low level, the counted value of the high-gate counter 90 is reset.

The high-edge output circuit 99 outputs the pulse to the latch circuit 96 and to the delay circuit 101 at a rising of the Q output as shown in FIG. 10(*j*). The latch circuit 96 latches the counted value of the counter circuit 95 based on the output of the high-edge output circuit 99. The pulse delayed by the delay circuit 101 is output as shown in FIG. 10(*l*).

At a timing t4, the counted value of the counter circuit 95 is reset by the delay pulse supplied from the delay circuit 101 shown in FIG. 10(*l*). A period between the timings t3 and t4 is the delay period T4 of the pulse output from the delay circuit 101.

At a timing t5, when the counted value of the low-gate counter 93 reaches the predetermined value, the gate circuit 94 supplies the pulse to the reset input of the R-S flip flop 92.

The R-S flip flop 92 sets the Q output of FIG. 10(*h*) at the low level and the inversed Q output of FIG. 10(*i*) at the high level based on the input to the reset input of the R-S flip flop 92. By the inversed Q output being switched to the high level, the high-gate counter 90 counts the clock pulses supplied from the AND gate 87 shown in FIG. 10(*c*), and by the inversed Q output being switched to the low level, the counted value of the low-gate counter 93 is reset.

The low-edge output circuit 102 outputs the pulse to the latch circuit 98 and to the delay circuit 103 at a falling of the Q output as shown in FIG. 10(*k*). The latch circuit 98 latches the counted value of the counter circuit 97 based on the output of the low-edge output circuit 102. The pulse delayed by the delay circuit 103 is output as shown in FIG. 10(*m*).

At a timing t6, the counted value of the counter circuit 97 is reset by the delay pulse supplied from the delay circuit 103 shown in FIG. 10(*m*). A period between the timings t5 and t6 is the delay period T4 of the pulse output from the delay circuit 103.

The switching circuit 78 performs a switching operation so that the counted value input to the A input is output when the Q output is at the high level, and the counted value input to the B input is output when the Q output is at the low level. That is, the output of the switching circuit 78 is switched to the counted value input to the A input based on the pulse supplied from the delay circuit 101 and to the counted value input to the B input based on the pulse supplied from the delay circuit 103.

According to this embodiment, the signal processing circuit 31 has the same effect as the signal processing circuit 30 of FIG. 7.

A description will now be given of a fourth embodiment of the present invention.

Figure 11:
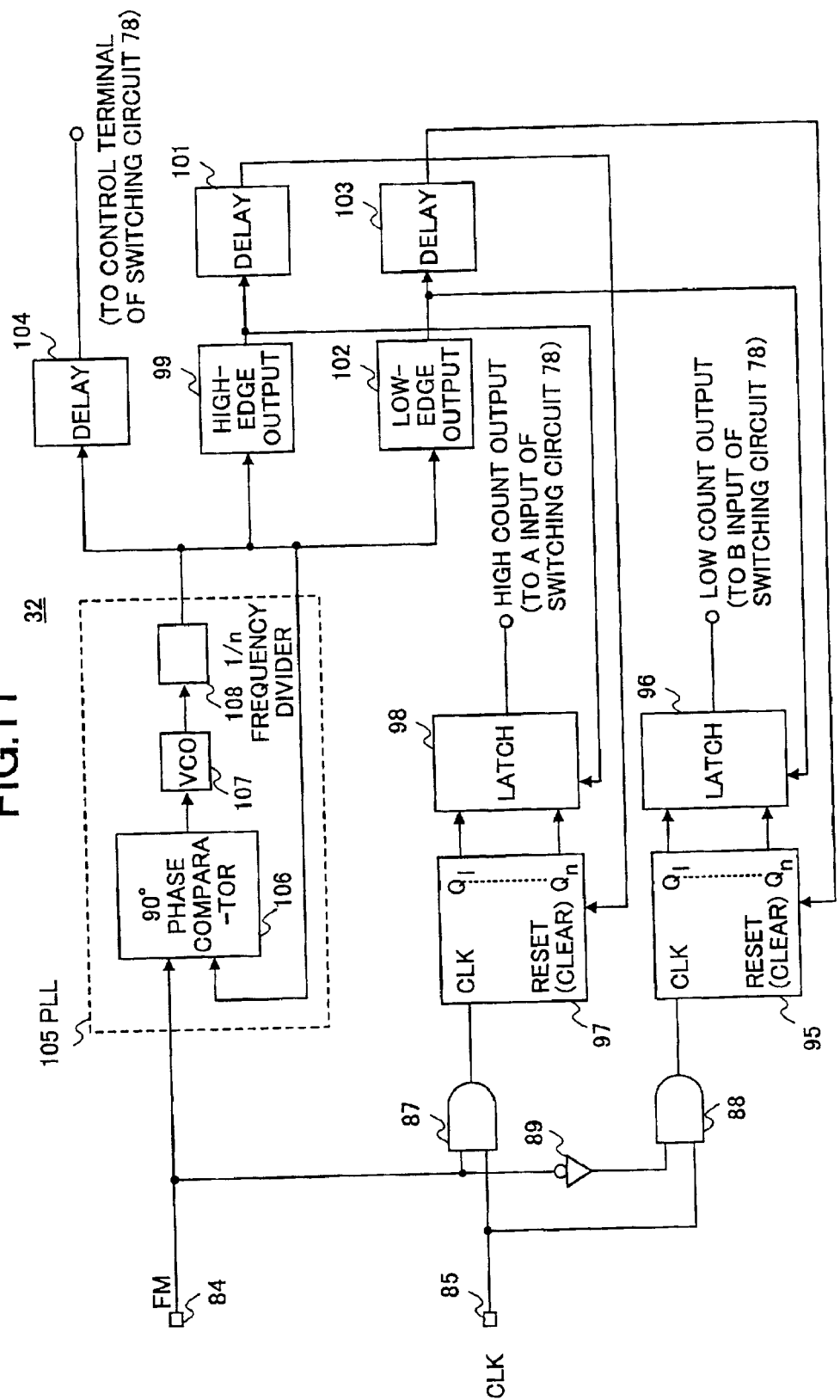
FIG. 11 is a block diagram of a signal processing circuit according to a fourth embodiment of the present invention.

FIG. 11 is a block diagram of a signal processing circuit 32 according to the fourth embodiment, and FIG. 12 is a timing chart of signals in the signal processing circuit 32. The signal processing circuit 32 is a variation of the signal processing circuit 31 of FIG. 9. In FIG. 11, the same elements as those of FIG. 9 are referred to by the same numerals and a description thereof will be omitted. The signal processing circuit 32 differs from the signal processing circuit 31 in that a PLL (phase-locked loop) circuit 105 and a delay circuit 104 replace the high-gate and low-gate counters 90 and 93, the gate circuits 91 and 94, and the R-S flip flop 92. A description will be given below of the PLL circuit 105 and the delay circuit 104.

The PLL circuit 105 includes a 90° phase comparator circuit 106, a VCO (voltage-controlled oscillator) 107, and a 1/N frequency divider 108. When an ideal FM pulse signal (PLL input signal) shown in FIG. 12(*a*) is supplied to the PLL circuit 105, the PLL circuit 105 outputs a PLL output signal shown in FIG. 12(*b*), which signal has a phase difference of 90° with respect to the FM pulse signal. The 90° phase comparator circuit 106 compares the phases of the FM pulse signal and the PLL output signal, and outputs the FM pulse signal to the VCO 107 so that a phase difference between the FM pulse signal and the PLL output signal is 90°. The VCO 107 generates a clock pulse signal of a predetermined frequency based on the supplied FM pulse signal. The clock pulse signal is supplied to the 1/N frequency divider 108, which divides the frequency of the clock pulse signal in a predetermined division ratio (1/N) so as to output the FM pulse signal having a phase difference of 90°. The FM pulse signal having the phase difference of 90° is supplied to the delay circuit 104, the high-edge and low-edge output circuits 99 and 102, and the 90° phase comparator circuit 106.

The delay circuit 104 delays the FM pulse signal supplied from the PLL circuit 105, and supplies the delayed FM pulse signal to the switching circuit 78.

The counted value of the counter circuit 95 is cleared by the pulse supplied from the delay circuit 103. The latch circuit 96 latches the supplied counted value of the counter circuit 95 based on the pulse supplied from the low-edge output circuit 102.

The counted value of the counter circuit 97 is cleared by the pulse supplied from the delay circuit 101. The latch circuit 98 latches the supplied counted value of the counter circuit 97 based on the pulse supplied from the high-edge output circuit 99.

FIGS. 12(*a*) through (*l*) show the ideal PLL input signal (FM pulse signal), the PLL output signal, an actual FM pulse signal (input signal) including chattering, the clock pulses (CLK), the output of the AND gate 87, the output of the inverter 89, the output of the AND gate 88, the output of the high-edge output circuit 99, the delay pulse supplied from the delay circuit 101, the output of the low-edge output circuit 102, the delay pulse supplied from the delay circuit 103, and the delay pulse supplied from the delay circuit 104, respectively. A description of the signals having the same timings as described in the third embodiment with reference to FIG. 10 will be omitted.

When the actual input signal of FIG. 12(c) is supplied to the PLL circuit 105, the PLL circuit 105 outputs the PLL output signal of FIG. 12(b).

At a timing t1, the high-edge output circuit 99 outputs the pulse as shown in FIG. 12(h) based on the PLL output signal of FIG. 12(b). The latch circuit 96 latches the counted value of the counter circuit 95 based on the pulse supplied from the high-edge output circuit 99.

At a timing t2, the counter circuit 95 is reset by the delay pulse output from the delay circuit 101. Thereafter, the counter circuit 95 resumes the count of the clock pulses supplied from the AND circuit 87 shown in FIG. 12(e).

At a timing t3, when the PLL output signal is switched to a low level, the low-edge output circuit 102 outputs the pulse at a falling of the PLL output signal as shown in FIG. 12(j). The latch circuit 98 latches the counted value of the counter circuit 97 based on the pulse supplied from the low-edge output circuit 102.

At a timing t4, the counter circuit 97 is reset by the delay pulse output from the delay circuit 103. Thereafter, the counter circuit 97 resumes the count of the clock pulses supplied from the AND gate 88 shown in FIG. 12(g).

During a period between timings t5 and t8, the same operation is repeated.

The counter circuit 95 counts the clock pulses of the positive polarity (active-high) period of the input signal of FIG. 12(c) for a period, for instance, a period between the timings t4 and t8, which is required before the counter circuit 95 is reset by the delay pulse output from the delay circuit 103.

The counter circuit 97 counts the clock pulses of the negative polarity (active-low) period of the input signal of FIG. 12(c) for a period, for instance, a period between the timings t4 and t8, which is required before the counter circuit 97 is reset by the delay pulse output from the delay circuit 101.

The delay circuit 104 supplies the switching circuit 78 with the pulse signal whose polarity is reversed at the timings at which the counter circuits 95 and 97 are reset. The switching circuit 78 performs a switching operation so as to output a latched one of the counted values based on the pulse signal supplied from the delay circuit 104. According to this embodiment, when the output signal of the delay circuit 104 has a positive polarity, the counted value latched by the latch circuit 96 is output, and when the output signal of the delay circuit 104 has a negative polarity, the counted value latched by the latch circuit 98 is output. In other words, the switching circuit 78 performs a switching operation so as to output the counted value latched at the timing t1 by the latch circuit 96 at the timing t2 at which the counter circuit 95 is reset. Further, the switching circuit 78 performs a switching operation so as to output the counted value latched at the timing t3 by the latch circuit 98 at the timing t4 at which the counter circuit 97 is reset.

According to this embodiment, the timings for counting the clock pulses in the positive and negative polarity periods of the FM pulse signal are obtained by generating, in the PLL circuit 105, the pulse having the phase difference of 90° with respect to the input signal. According to this embodiment, the timings for counting the clock pulses can be obtained only through the PLL circuit 105, thus allowing the signal processing circuit 32 to have a simple structure compared with the signal processing circuit 31.

The present invention is not limited to the specifically disclosed embodiments, and variations and modifications may be made without departing from the scope of the present invention.

The present application is based on Japanese priority applications No. 11-361558 filed on Dec. 20, 1999, and No. 2000-381245 filed on Dec. 15, 2000, the entire contents of which are hereby incorporated by reference.

What is claimed is:

1. A signal processing circuit generating a digital signal based on an input pulse signal, the signal processing circuit comprising:

a clock pulse output part configured to output clock pulses in accordance with a polarity of the input pulse signal in a predetermined period including a pulse of the input pulse signal and tolerating a noise component, the polarity of the input pulse signal being switchable between positive and negative in the predetermined period;

a counter part configured to count the clock pulses output when the polarity of the input pulse signal is positive and the clock pulses output when the polarity of the input pulse signal is negative independent of each other;

a setting part configured to set the predetermined period based on a predetermined counted value of the counter part; and an output part configured to output the digital signal based on a counted value of said counter part.

2. The signal processing circuit as claimed in claim 1, wherein:

said clock pulse output part comprises:

a first clock pulse output part configured to output the clock pulses when the polarity of the input pulse signal is positive; and a second clock pulse output part configured to output the clock pulses when the polarity of the input pulse signal is negative; and said counter part comprises:

a first counter part configured to count the clock pulses supplied from said first clock pulse output part; and a second counter part configured to count the clock pulses supplied from said second clock pulse output part.

3. The signal processing circuit as claimed in claim 2, wherein:

said first counter part outputs a first timing signal at the predetermined counted value;

said second counter part outputs a second timing signal at the predetermined counted value; and said output part comprises:

a first latch part configured to latch a counted value of said first counter part based on the second timing signal; and a second latch part configured to latch a counted value of said second counter part based on the first timing signal.

4. The signal processing circuit as claimed in claim 3, wherein:

said output part comprises:

a first delay part configured to delay the first timing signal; and a second delay part configured to delay the second timing signal;

said first counter part is reset by an output signal of said second delay part; and said second counter part is reset by an output signal of said first delay part.

5. The signal processing circuit as claimed in claim 4, wherein said output part further comprises:
a flip flop set by the output signal of said first delay part and reset by the output signal of said second delay part; and
a switching part configured to switch, based on an output of said flip flop, an output thereof between the counted values latched by said first and second latch parts, respectively.

6. The signal processing circuit as claimed in claim 2, wherein said counter part further comprises:
a third counter part configured to count the clock pulses supplied from said first clock pulse output part; and
a fourth counter part configured to count the clock pulses supplied from said second clock pulse output part,
wherein the setting part sets the predetermined period based on respective predetermined counted values of said third and fourth counter parts.

7. The signal processing circuit as claimed in claim 6, wherein:
said third counter part outputs a first timing signal at the predetermined counted value of said third counter part
said fourth counter part outputs a second timing signal at the predetermined counted value of said fourth counter part; and
said setting part outputs, based on the first and second timing signals, a signal which determines the predetermined period.

8. The signal processing circuit as claimed in claim 7, wherein said setting part comprises a flip flop set by the first timing signal and reset by the second timing signal.

9. The signal processing circuit as claimed in claim 8, wherein one of the counted values of said third and fourth counter parts is reset when said flip flop is reset.

10. The signal processing circuit as claimed in claim 8, wherein said output part comprises:
a rising edge output part configured to output a third timing signal at a rising edge of an output of said flip flop;
a falling edge output part configured to output a fourth timing signal at a falling edge of the output of said flip flop;
a first latch part configured to latch a counted value of said first counter part based on the fourth timing signal; and
a second latch part configured to latch a counted value of said second counter part based on the third timing signal.

11. The signal processing circuit as claimed in claim 10, wherein:
said output part further comprises:
a first delay part configured to delay the third timing signal and output a fifth timing signal; and
a second delay part configured to delay the fourth timing signal and output a sixth timing signal;
said first counter part is reset by the sixth timing signal; and
said second counter part is reset by the fifth timing signal.

12. The signal processing circuit as claimed in claim 10, wherein said output part further comprises a switching part configured to switch, based on an output of said flip flop, an output thereof between the counted values latched by said first and second latch parts, respectively.

13. The signal processing circuit as claimed in claim 1, wherein said output part includes a digital low-pass filter.

14. A method of generating a digital signal based on an input pulse signal, the method comprising the steps of:
(a) outputting clock pulses in accordance with a polarity of the input pulse signal in a predetermined period including a pulse of the input pulse signal and tolerating a noise component, the polarity of the input pulse signal being switchable between positive and negative in the predetermined period;
(b) counting the clock pulses output when the polarity of the input pulse signal is positive and the clock pulses output when the polarity of the input pulse signal is negative independent of each other;
c) setting the predetermined period based on a predetermined counted value of the counter part; and
(d) outputting the digital signal based on a counted value obtained in said step (b).

15. A signal processing circuit generating a digital signal based on an input pulse signal, the signal processing circuit comprising:
a clock pulse output part configured to output clock pulses in accordance with a polarity of the input pulse signal in a predetermined period including a pulse of the input pulse signal and tolerating a noise component, the polarity of the input pulse signal being switchable between positive and negative in the predetermined period;
a counter part configured to count the clock pulses output when the polarity of the input pulse signal is positive and the clock pulses output when the polarity of the input pulse signal is negative independent of each other;
a setting part configured to set the predetermined period based on a phase difference pulse signal having a predetermined phase difference with respect to the input pulse signal; and
an output part configured to output the digital signal based on a count value of the counter part.

16. The signal processing circuit as claimed in claim 15, wherein:
the clock pulse output part includes:
a first clock pulse output part configured to output the clock pulses when the polarity of the input pulse signal is positive; and
a second clock pulse output part configured to output the clock pulses when the polarity of the input pulse signal is negative; and
the counter part includes:
a first counter part configured to count the clock pulses supplied from the first clock pulse output part; and
a second counter part configured to count the clock pulses supplied from the second clock pulse output part.

17. The signal processing circuit as claimed in claim 16, wherein:
the setting part includes:
a rising edge output part configured to output a first timing signal at a rising edge of the phase difference pulse signal; and
a falling edge output part configured to output a second timing signal at a falling edge of the phase difference pulse signal; and
the output part includes:
a first latch part configured to latch a count value of the first counter part based on the first timing signal; and a second latch part configured to latch a count value of the second counter part based on the second timing signal.

18. The signal processing circuit as claimed in claim 17, wherein:

the output part includes:

a first delay part configured to delay the first timing signal and output a third timing signal; and a second delay part configured to delay the second timing signal and output a fourth timing signal;

the first counter part is reset based on the third timing signal; and the second counter part is reset based on the fourth timing signal.

19. The signal processing circuit as claimed in claim 17, wherein:

the output part includes:

a third delay part configured to delay the phase difference pulse signal and output a delayed phase difference pulse signal; and a switching part configured to switch, based on the delayed phase difference pulse signal, an output thereof between the first count value latched by the first latch part and the second count value latched by the second latch part.

20. A method of generating a digital signal based on an input pulse signal, the method comprising the steps of:

(a) outputting clock pulses in accordance with a polarity of the input pulse signal in a predetermined period including a pulse of the input pulse signal and tolerating a noise component, the polarity of the input pulse signal being switchable between positive and negative in the predetermined period;

(b) counting the clock pulses output when the polarity of the input pulse signal is positive and the clock pulses output when the polarity of the input pulse signal is negative independent of each other;

(c) setting the predetermined period based on a phase difference pulse signal having a predetermined phase difference with respect to the input pulse signal; and (d) outputting the digital signal based on a count value obtained in said step (b).

* * * * *